US012628592B2

(12) United States Patent
Kwon et al.

(10) Patent No.: US 12,628,592 B2
(45) Date of Patent: May 12, 2026

(54) SUBSTRATE PROCESSING METHOD

(71) Applicant: TES Co., Ltd, Yongin-si (KR)

(72) Inventors: Bongsoo Kwon, Yongin-si (KR); Dohyun Kim, Yongin-si (KR); Yuri Park, Yongin-si (KR)

(73) Assignee: TES CO., LTD, Yongin-si (KR)

( * ) Notice: Subject to any disclaimer, the term of this patent is extended or adjusted under 35 U.S.C. 154(b) by 0 days.

(21) Appl. No.: 19/002,786

(22) Filed: Dec. 27, 2024

(65) Prior Publication Data

US 2025/0218785 A1 Jul. 3, 2025

(30) Foreign Application Priority Data

Dec. 13, 2024 (KR) ........................ 10-2024-0185739

(51) Int. Cl.
*H10P 50/64* (2026.01)
*H10P 50/24* (2026.01)
*C09K 13/04* (2006.01)

(52) U.S. Cl.
CPC .......... *H10P 50/642* (2026.01); *H10P 50/242* (2026.01); *C09K 13/04* (2013.01)

(58) Field of Classification Search
None
See application file for complete search history.

(56) References Cited

U.S. PATENT DOCUMENTS

2003/0134494 A1 7/2003 Ikehara
2003/0207480 A1 11/2003 Kobayashi et al.
2004/0110354 A1* 6/2004 Natzle .................. H10D 84/038 257/E21.252
2017/0345665 A1* 11/2017 Faguet .............. H01L 21/67069
2019/0013207 A1* 1/2019 Kobayashi ........ H01L 21/02063
2022/0359006 A1 11/2022 Ramkumar et al.
2022/0359220 A1* 11/2022 Lim .................. H01L 21/31111
2024/0079248 A1* 3/2024 Kwon ............... H01L 21/31111

FOREIGN PATENT DOCUMENTS

KR 10-2019-0096785 A 8/2019
KR 10-2325905 B1 11/2021
TW 444269 B 7/2001
TW 200305209 A 10/2003
TW 200929366 A 7/2009

OTHER PUBLICATIONS

Taiwanese Office Action for related TW Application No. 113150851 mailed Apr. 21, 2025 from Taiwan Intellectual Property Office.

* cited by examiner

*Primary Examiner* — Shamim Ahmed
(74) *Attorney, Agent, or Firm* — Paratus Law Group, PLLC

(57) ABSTRACT

Disclosed is a substrate processing method for selectively etching a re-growth silicon oxide formed on a surface of a silicon oxide layer and having a density lower than a density of the silicon oxide layer. The method includes: (a) placing a substrate including the re-growth silicon oxide into a reaction chamber; and (b) supplying an etching gas into the reaction chamber to dry-etch the re-growth silicon oxide formed on the surface of the silicon oxide layer, wherein the dry-etching is performed using HF and $H_2O$ as an etching gas at about 40° C. or lower.

8 Claims, 12 Drawing Sheets

(a)

(b)

(a)

(b)

SUBSTRATE PROCESSING METHOD

CROSS-REFERENCE TO RELATED APPLICATION

This application claims priority to Korean Patent Application Nos. 10-2023-0193333 (filed on Dec. 27, 2023) and 10-2024-0185739 (filed on Dec. 13, 2024), which are all hereby incorporated by reference in their entirety.

BACKGROUND

The present disclosure relates to a substrate processing method. More specifically, the present disclosure relates to a substrate processing method capable of efficiently removing re-growth silicon oxide generated at a corner of a silicon oxide layer during wet-etching of a silicon nitride layer using a phosphoric acid-based etchant.

Recently, as semiconductor devices are miniaturized, semiconductor devices are gradually becoming highly integrated. Since the silicon nitride film is used as a dielectric film or an insulating film having a chemically stable characteristic, the silicon nitride film is widely used in DRAM and FLASH Memory manufacturing processes, such as being used as a side wall material in a contact process or a capping process as well as a basic device isolation process of a memory device.

In this regard, when manufacturing the semiconductor device, silicon oxide layers and silicon nitride layers may be alternately stacked on top of each other in multiple layers. In this case, in order to selectively etch the silicon nitride layers, an etchant having a higher etch selectivity relative to the silicon nitride layers than relative to the silicon oxide layer should be applied.

Conventionally, a phosphoric acid-based etchant is known as the etchant having the higher etch selectivity relative to the silicon nitride layers than relative to the silicon oxide layer. The etching of the silicon nitride layer using the phosphoric acid-based etchant is wet-etching.

It is known that the wet-etching of the silicon nitride layer using the phosphoric acid-based etchant involves a reaction according to a following reaction formula 1 and is performed at a high temperature.

[Reaction Formula 1

$$3Si_3N_4+27H_2O+4H_3PO_4 \leftrightarrow 4(NH_4)_3PO_4+9H_2OSiO_2.$$

In this case, the regrowth silicon oxide generated at the corner portion of the silicon oxide layer during the wet-etching of the silicon nitride layer using the phosphoric acid-based etchant is problematic.

The re-growth silicon oxide is known as a factor that affects a subsequent process and degrades electrical characteristics of a semiconductor device to be finally manufactured.

In general, it is known that a silicon-based compound is contained as an additive in the phosphoric acid-based etchant to generate the re-growth silicon oxide. To solve this problem, it has been proposed that the regrowth silicon oxide itself is suppressed during wet-etching of the silicon nitride layer through adjustment of the additive contained in the phosphoric acid-based etchant. However, these methods have a disadvantage in that the wet-etching process time for etching the silicon nitride layer is very long.

SUMMARY

As described above, the conventional method of suppressing the generation of re-growth silicon oxide during wet-etching of the silicon nitride layer has a disadvantage in that the process time is very long.

Accordingly, a purpose to be achieved by the present disclosure is to provide a substrate processing method capable of efficiently removing the re-growth silicon oxide using a separate dry-etching scheme, instead of suppressing the generation of the re-growth silicon oxide in the wet-etching of the silicon nitride layer.

In addition, a purpose to be achieved by the present disclosure is to provide a substrate processing method capable of increasing an etch selectivity of a re-growth silicon oxide compared to that of an oxide formed via deposition or the like.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims or combinations thereof.

In order to achieve the purposes, a first aspect of the present disclosure provides a method for processing a substrate so as to selectively etch a re-growth silicon oxide formed on a surface of a silicon oxide layer and having a density lower than a density of the silicon oxide layer, the method comprising: (a) placing a substrate including the re-growth silicon oxide into a reaction chamber; and (b) supplying an etching gas into the reaction chamber to dry-etch the re-growth silicon oxide formed on the surface of the silicon oxide layer, wherein the dry-etching is performed using HF and $H_2O$ as an etching gas at about 40° C. or lower.

In accordance with some embodiments of the method of the first aspect, the (b) is performed at a substrate temperature of about −10° C. to 20° C.

In accordance with some embodiments of the method of the first aspect, the (b) is performed at a process pressure of about 1.2 to 4.0 Torr.

In accordance with some embodiments of the method of the first aspect, the (b) is performed at a process pressure of about 1.2 to 3.0 Torr.

In accordance with some embodiments of the method of the first aspect, the (b) is performed at a HF flow rate of about 70 to 100 sccm.

In accordance with some embodiments of the method of the first aspect, the (b) is performed at a $H_2O$ flow rate of about 50 to 300 sccm.

In accordance with some embodiments of the method of the first aspect, the method further comprises, after the dry-etching, raising a temperature of the substrate to remove a reaction by-product.

In accordance with some embodiments of the method of the first aspect, the dry-etching, the substrate temperature raising, and purging constitute a unit cycle, wherein the method further comprises performing a plurality of unit cycles.

A second aspect of the present disclosure provides a method for processing a substrate, the method comprising:

(a) wet-etching a silicon nitride layer on a substrate having a stack formed thereon, using a phosphoric acid-based etchant, wherein the stack has a structure in which silicon oxide layers and silicon nitride layers are stacked on top of each other, wherein a re-growth silicon oxide is formed on a surface of the silicon oxide layer in the wet-etching; and (b) dry-etching the re-growth silicon oxide formed on the surface of the silicon oxide layer using an etching gas, wherein the (b) is performed using HF and $H_2O$ as the etching gas at about 40° C. or lower.

In accordance with some embodiments of the method of the second aspect, the (b) is performed at a substrate temperature of about −10° C. to 20° C.

In accordance with some embodiments of the method of the second aspect, the (b) is performed at a process pressure of about 1.2 to 4.0 Torr.

In accordance with some embodiments of the method of the second aspect, the (b) is performed at a HF flow rate of about 70 to 100 sccm.

In accordance with some embodiments of the method of the second aspect, the (b) is performed at a $H_2O$ flow rate of about 50 to 300 sccm.

In accordance with some embodiments of the method of the second aspect, the method further comprises, after the dry-etching, raising a temperature of the substrate to remove a reaction by-product.

In accordance with some embodiments of the method of the second aspect, the dry-etching, the substrate temperature raising, and purging constitute a unit cycle, wherein the method further comprises performing a plurality of unit cycles.

According to the substrate processing method according to the present disclosure, the re-growth silicon oxide produced in the phosphoric acid-based wet-etching process or the like may be effectively removed at a high selectivity via the dry-etching using HF and $H_2O$ as the etching gas at a substrate temperature of about 40° C. or lower, more preferably about −10° C. to 20° C.

In addition, in accordance with the present disclosure, using HF and $H_2O$ as the etching gas may result in the increase in the etch selectivity of the re-growth silicon oxide formed on the middle portion and the lower portion of the ONO stack without damaging the silicon oxide film of the upper portion of the ONO stack, compared to using HF and $NH_3$.

In addition, according to the present disclosure, the effect of removing the re-growth silicon oxide may be increased via the control of the process temperature, the process pressure, and the flow rate of the etching gas.

The effects of the present disclosure are not limited to the above-mentioned effects, and other effects as not mentioned will be clearly understood by those skilled in the art from the following detailed description.

DETAILED DESCRIPTIONS

Figure 1:
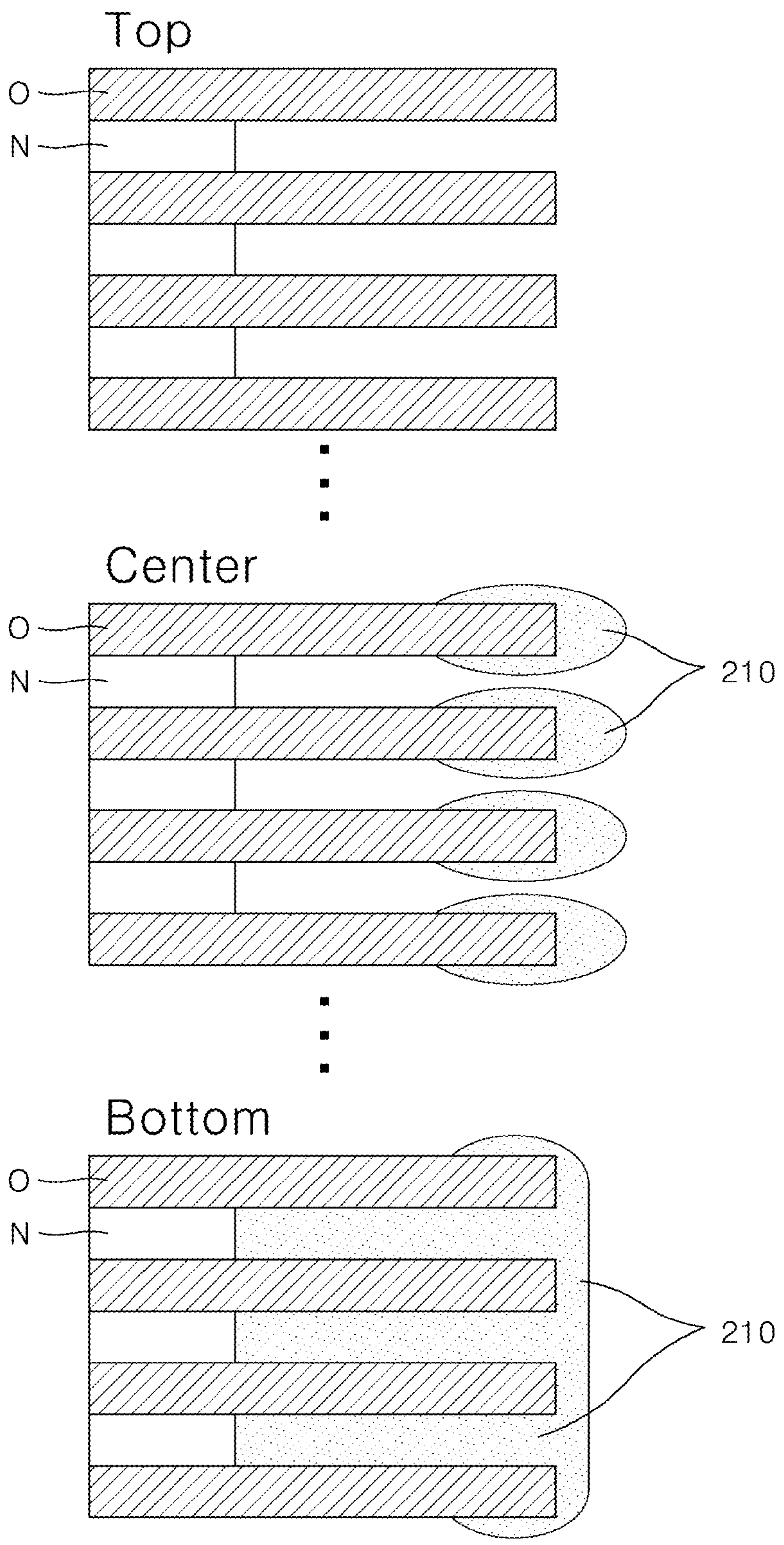
FIG. 1 schematically illustrates that a re-growth silicon oxide layer has been formed on a middle portion and a lower portion of an ONO stack in a phosphoric acid-based wet-etching process.

Hereinafter, a preferred embodiment of the present disclosure will be described in detail with reference to the accompanying drawings. Advantages and features of the present disclosure, and a method of achieving the advantages and features will become apparent with reference to embodiments described below in detail together with the accompanying drawings. However, the present disclosure is not limited to the embodiments as disclosed below, but may be implemented in various different forms. Thus, these embodiments are set forth only to make the present disclosure complete, and to entirely inform the scope of the present disclosure to those of ordinary skill in the technical field to which the present disclosure belongs, and the present disclosure is only defined by the scope of the claims.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for illustrating embodiments of the present disclosure are illustrative, and the present disclosure is not limited thereto.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items.

The features of the various embodiments of the present disclosure may be partially or entirely combined with each other, and may be technically associated with each other or operate with each other. The embodiments may be implemented independently of each other and may be implemented together in an association relationship.

Hereinafter, a substrate processing method according to a preferred embodiment of the present disclosure will be described in detail with reference to the accompanying drawings as follows.

A substrate processing method according to an embodiment of the present disclosure relates to a method for removing a re-growth silicon oxide film formed on a surface of a silicon oxide layer on a substrate on which a stack of silicon oxide layers and silicon nitride layers stacked on top of each other has been formed.

The substrate may be, for example, a substrate having an oxide-nitride-oxide (ONO) stack formed thereon, wherein the ONO stack has structure in which the silicon oxide layers and the silicon nitride layers are alternately stacked on top of each other. For example, each of the number of the silicon oxide layers and the number of the silicon nitride layers in the ONO stack is several, dozens, or even 200 to 400.

A through-hole may extend through the ONO stack to expose side surfaces of the silicon oxide layers and the silicon nitride layers.

In accordance with the present disclosure, the upper portion Top of the ONO stack may be a portion up to ⅓ in the downward direction from the surface of the ONO stack, the lower portion Bottom of the ONO stack may be a portion up to ⅓ in the upward direction from the substrate contact surface of the ONO stack, and the middle portion Center of the ONO stack may be a portion between the upper portion and the lower portion.

FIG. 1 schematically illustrates that a re-growth silicon oxide layer has been formed on a middle portion and a lower portion of an ONO stack in a phosphoric acid-based wet-etching process.

Referring to FIG. 1, the silicon nitride layers of the ONO stack are etched by the phosphoric acid-based wet-etching process. At this time, a re-growth silicon oxide film 210 is formed on the surface of the silicon oxide layer of the ONO stack. FIG. 1 shows that the re-growth silicon oxide layer is mainly formed on the middle portion Center and the lower portion Bottom of the ONO stack, and in particular, a large amount of the re-growth silicon oxide layer is formed on the lower portion Bottom of the ONO stack.

When such a re-grown silicon oxide film is present, it becomes difficult to perform subsequent processes such as deposition. Thus, the re-grown silicon oxide film needs to be removed.

Based on a result of long research, the inventors of the present disclosure have found that the re-growth silicon oxide film generated in the phosphoric acid-based wet-etching process or the like may be efficiently removed by performing dry-etching using HF and $H_2O$ as an etching gas at a substrate temperature of 40° C. or lower. In particular, it has been found that the re-growth silicon oxide film may be removed at a higher selectivity of the re-growth silicon oxide film than that of the silicon oxide layer of the ONO stack by performing dry-etching using HF and $H_2O$ as an etching gas at a substrate temperature of 40° C. or lower.

More specifically, the substrate processing method according to an embodiment of the present disclosure includes a silicon nitride layer wet-etching step and a re-growth silicon oxide dry-etching step.

In the wet-etching of the silicon nitride layer, the silicon nitride layer is wet-etched using a phosphoric acid etchant. As the phosphoric acid-based etchant, a known etchant including phosphoric acid may be used. The phosphoric acid-based etchant may include a silicon-based compound such as hexafluorosilicate, TEOS, or the like in order to increase the etch selectivity of the silicon nitride layer compared to that of the silicon oxide layer.

As described above, when the silicon nitride layer is wet-etched using a phosphoric acid-based etchant to selectively etch the silicon nitride layer on the substrate on which the silicon oxide layers and the silicon nitride layers have been stacked alternately on top of each other, the regrowth silicon oxide may be generated on the surface of the silicon oxide layer. The re-growth silicon oxide is distinguished from the silicon oxide layer formed via the deposition or thermal oxidation in that the re-growth silicon oxide is not dense at a relatively lower density compared to that of the silicon oxide layer formed via deposition or the like, and is soft. The re-grown silicon oxide film may not only make subsequent processes difficult, but also may impair the electrical characteristics of the device, and needs to be removed.

Conventionally, a scheme of suppressing the formation itself of the re-growth silicon oxide in the wet-etching process by controlling the additive into the phosphoric acid-based etchant, etc. has been employed but has a disadvantage in that the process time is very long. Accordingly, according to the present disclosure, the re-growth silicon oxide generated in the wet-etching process is removed, instead of suppressing the generation of the re-growth silicon oxide in the wet-etching process.

More specifically, in the dry-etching step, the re-growth silicon oxide generated on the surface of the silicon oxide layer in the wet-etching step is dry-etched using an etching gas. Specifically, the re-growth silicon oxide having a density lower than the density of the silicon oxide layer and formed on the surface of the silicon oxide layer is selectively dry-etched. The dry-etching may be performed on a cycle basis, and preferably, may be performed in a plurality of cycles (n cycles). The unit cycle may be composed of dry-etching, temperature-increasing, and purging. When the dry-etching is performed in the plurality of cycles, additional advantages such as reduced damage of the lower portion of the stack may be obtained.

In this regard, the important thing is to increase the etch selectivity of the re-growth silicon oxide compared to the etch selectivity of the silicon oxide layer previously formed through deposition, thermal oxidation, or the like. The etch selectivity of the re-growth silicon oxide and the etch selectivity of the silicon oxide layer may be 5 or greater: 1, preferably, 10 or greater: 1, and more preferably, 15 or greater: 1. The etch selectivity of the re-growth silicon oxide relative to that of the silicon oxide layer may be controlled by adjusting the substrate temperature, the process pressure, the type of etching gas, the flow rate, and the like, as described below.

In accordance with the present disclosure, the dry-etching may be performed using HF and water vapor ($H_2O$) as an etching gas at a substrate temperature of 40° C. or lower, more preferably, −10 to 20° C. In this case, the efficiency of removing the re-growth silicon oxide was higher than that of the related art.

The water is vaporized into the water vapor while passing through the vaporizer, and the flow rate of the water vapor is controlled by a mass flow controller (MFC), so that the water vapor at the controlled flow rate may be introduced into the reaction chamber. In an embodiment of the present disclosure, the water vapor was supplied into the reaction chamber in the above manner.

In one example, hydrogen fluoride (HF) and/or water vapor ($H_2O$) may be supplied into the reaction chamber alone or together with an inert gas such as argon gas.

After the dry-etching, a step of raising the temperature of the substrate to about 150 to 300° C. to remove the reaction by-products may be added to the substrate processing method. In this regard, the heating means for raising the temperature of the substrate is not particularly limited. Various means such as lamp heating, susceptor heating, and high temperature gas supply may be used for raising the temperature of the substrate. In addition, even after the dry-etching using the etching gas composed of only fluorine, the temperature raising step may be performed for the purpose of reducing fluorine. After the etching step and/or the heating step, a purge step of purging the inside of the reaction chamber and/or a pumping step of removing the gas inside the reaction chamber may be further included in the substrate processing method. Depending on the type of the etching gas, whether the heating step is applied may be determined, and the process order may vary.

In addition, the dry-etching step for removing the re-growth silicon oxide is preferably performed at a process pressure of 1.2 to 4.0 Torr, and more preferably, performed at a process pressure of 1.2 to 3.0 Torr. When the process pressure is lower than 1.2 Torr, the effect of removing the re-growth silicon oxide layer may not be great. On the other hand, when the process pressure exceeds 4 Torr, the etching of the silicon oxide layer of the stack occurs, such that the etch selectivity of the regrowth silicon oxide film may be greatly reduced.

In addition, in the dry-etching step, the flow rate of HF is preferably in a range of 70 to 100 sccm. When the flow rate of HF is lower than 70 sccm, the regrowth silicon oxide film removal efficiency is not high, and thus the etch selectivity of the regrowth silicon oxide film may be lowered. In addition, when the flow rate of HF exceeds 100 sccm, the etched amount of the silicon oxide layer of the ONO stack may increase, and thus, the etch selectivity of the regrowth silicon oxide film may be lowered.

In one example, it is preferable that the flow rate of $H_2O$ is in a range of 50 to 300 sccm. When the flow rate of $H_2O$ is too small to be smaller than 50 sccm, the etched amount of the silicon oxide layer of the ONO stack may be increased and thus, the etch selectivity of the regrowth silicon oxide film may be lowered. On the contrary, when the flow rate of $H_2O$ exceeds 300 sccm, the regrowth silicon oxide film removal efficiency may not be high.

Figure 2:
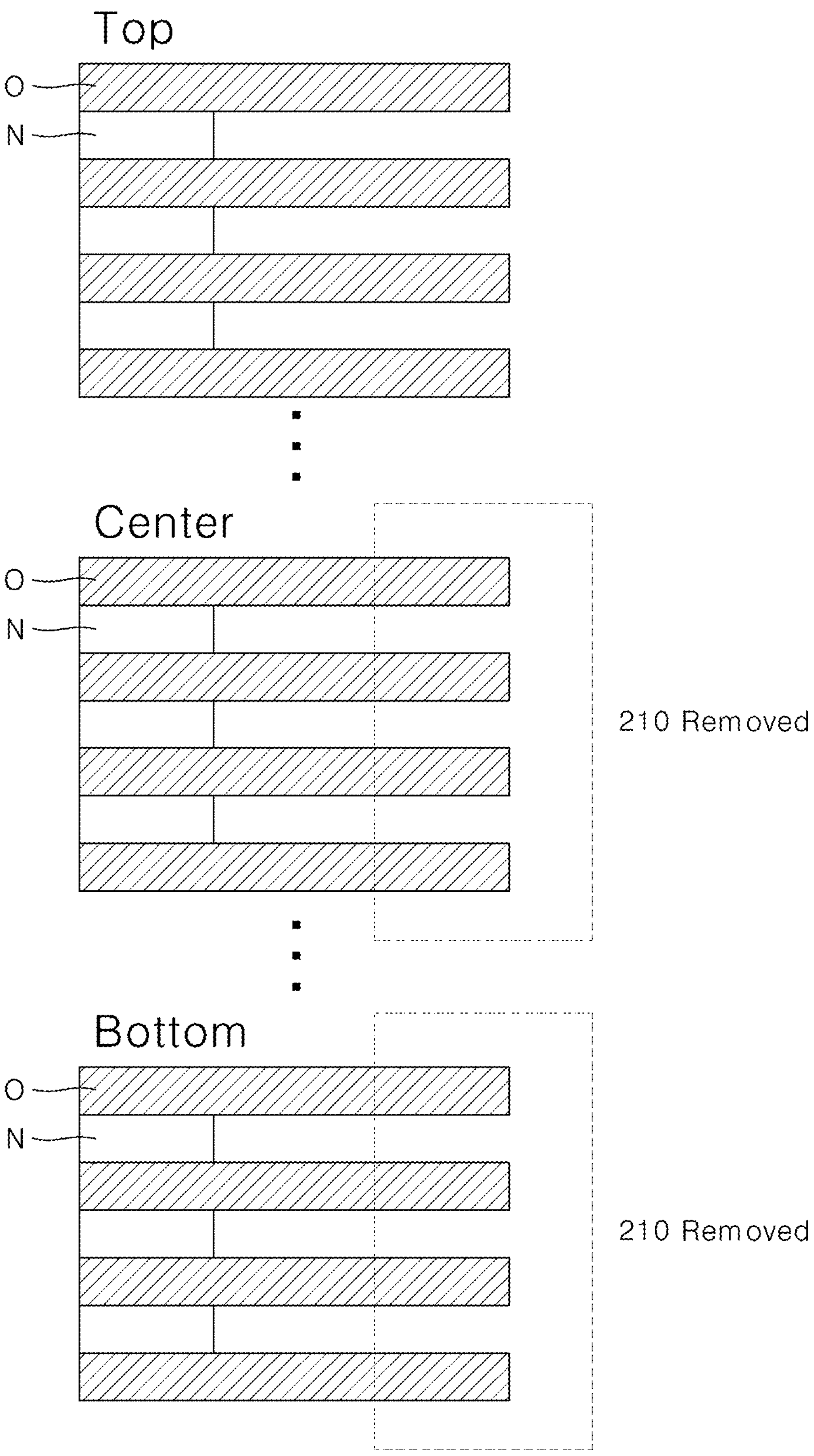
FIG. 2 schematically illustrates a view of a substrate dry-etched using a method according to an embodiment of the present disclosure.

FIG. 2 schematically illustrates a view of a substrate dry-etched using the substrate processing method according to an embodiment of the present disclosure.

When, at 40° C. or lower, the dry-etching is performed using HF and $H_2O$ as the etching gas, the re-growth silicon oxide film 210 may be effectively removed without substantial damage to the silicon oxide layer O of the ONO stack, as shown in FIG. 2.

Figure 3:
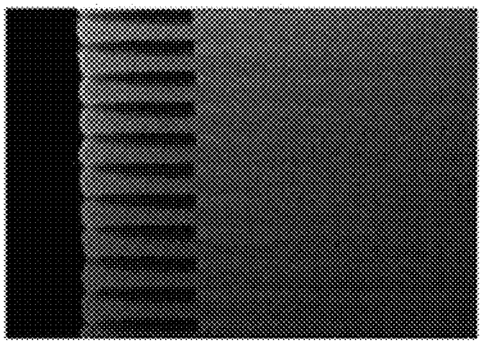
FIG. 3 is (a) a photomicrograph of a lower portion of the ONO stack on which the phosphoric acid etching process has been performed, and (b) a photomicrograph of a lower portion of the ONO stack after the etching process has been performed using HF+$H_2O$ as an etching gas.
Figure 3:
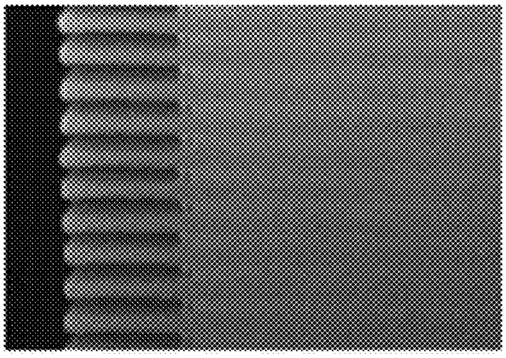

FIG. 3 is (a) a photomicrograph of a lower portion of the ONO stack on which the phosphoric acid etching process has been performed, and (b) a photomicrograph of a lower portion of the ONO stack after the etching process has been performed using HF+$H_2O$ as an etching gas.

Referring to FIG. 3, when the dry-etching is performed on the re-growth silicon oxide prior to the dry-etching using HF+ water vapor at a substrate temperature of 20° C., the re-growth silicon oxide removal effect is more excellent. In one example, in the dry-etching with HF alone at a substrate temperature of 100° C. or higher, there is a limit to the effect of removing the re-growth silicon oxide FIG. 4 schematically shows an upper portion of the ONO stack after performing an etching process using HF+$NH_3$ as an etching gas.

Figure 4:
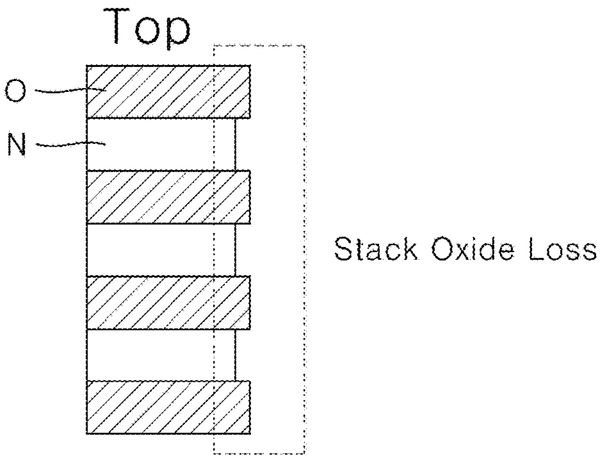
FIG. 4 schematically shows an upper portion of the ONO stack after performing an etching process using HF+$NH_3$ as an etching gas.

When HF+$NH_3$ is used as the etching gas, the silicon oxide layer of the upper portion of the ONO stack may be severely damaged as shown in FIG. 4 due to the adsorption of $NH_3$ to the silicon oxide layer of the upper portion of the ONO stack.

Hereinafter, a configuration and an effect of the present disclosure will be described in more detail through preferred Examples of the present disclosure. However, this is presented as a preferred implementation of the present disclosure and cannot be interpreted as limiting the present disclosure in any sense.

The contents not described herein may be sufficiently technically inferred by those skilled in this technical field, and thus the description thereof will be omitted.

Hereinafter, RGO refers to a re-growth silicon oxide, and STO refers to a silicon oxide of the stack.

a.u is a relative value obtained by dividing a corresponding value by a reference value.

Figure 5:
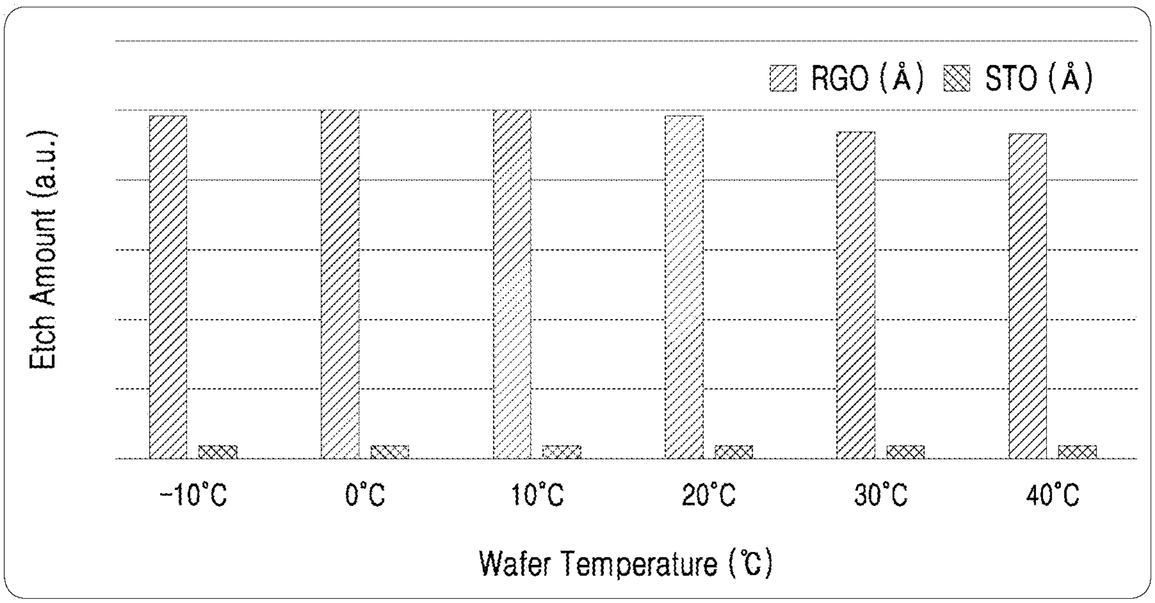
FIG. 5 shows a difference between etched amounts based on a substrate temperature of a re-growth silicon oxide (RGO) layer and a silicon oxide layer (STO) of the stack using HF and water vapor.
Figure 6:
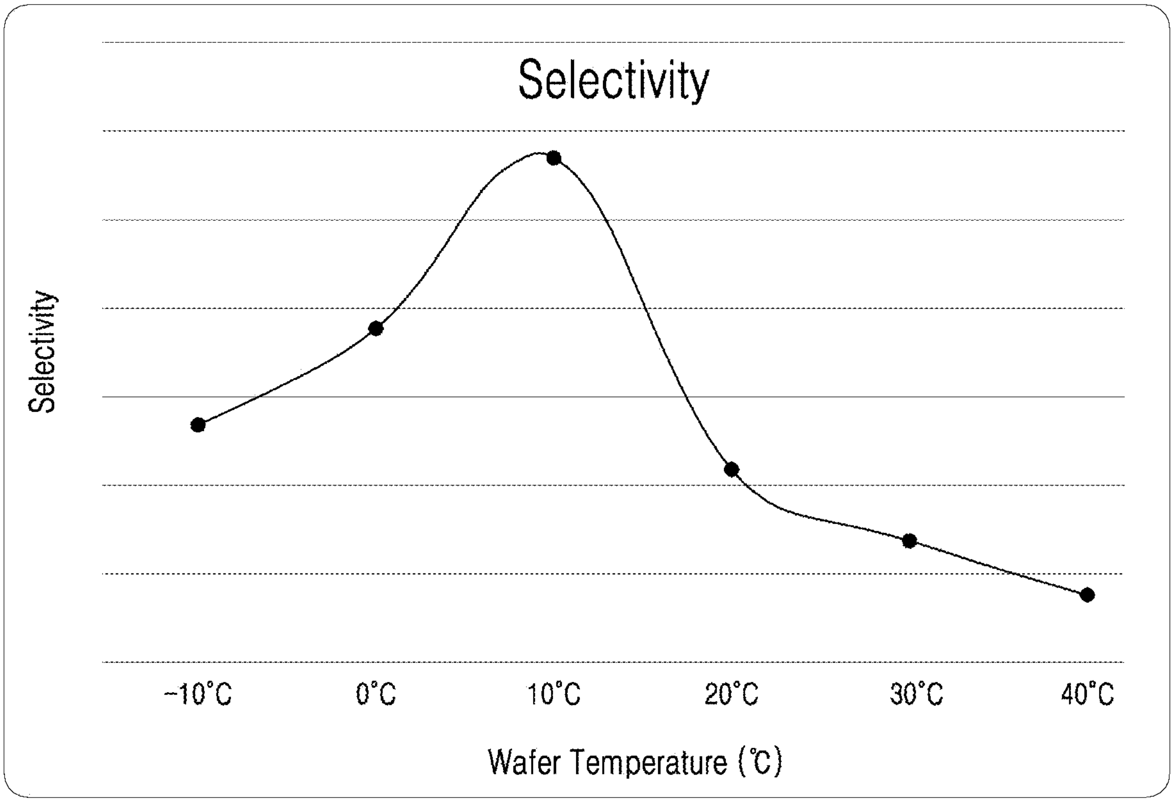
FIG. 6 shows a difference between etch selectivity based on a substrate temperature of a re-growth silicon oxide (RGO) layer and a silicon oxide layer (STO) of the stack using HF and water vapor.

FIG. 5 and Table 1 show a difference between etched amounts based on a substrate temperature of a re-growth silicon oxide (RGO) layer and a silicon oxide layer (STO) of the stack using HF and water vapor. FIG. 6 and Table 1 show a difference between etch selectivity based on a substrate temperature of a re-growth silicon oxide (RGO) layer and a silicon oxide layer (STO) of the stack using HF and water vapor. Referring to Table 1, the HF and water vapor flow rates and the process pressure used for the etching are as follows.

HF: 100 sccm

Water vapor: 300 sccm

Process pressure: 2 Torr

TABLE 1

| | Substrate temperature (° C.) | | | | | |
|---|---|---|---|---|---|---|
| | −10 | 0 | 10 | 20 | 30 | 40 |
| RGO (Å) | 7.9 | 8.2 | 8.945 | 7.84 | 7.51 | 7.47 |
| a.u | 0.9875 | 1.025 | 1.118125 | 0.98 | 0.93875 | 0.93375 |
| STO (Å) | 0.311 | 0.298 | 0.284 | 0.321 | 0.33 | 0.346 |
| a.u | 0.038875 | 0.03725 | 0.0355 | 0.040125 | 0.04125 | 0.04325 |
| Selectivity | 25.40193 | 27.51678 | 31.49648 | 24.42368 | 22.75758 | 21.5896 |

Referring to Table 1, it may be identified that although there is no significant difference in the etched amount (E/A) based on the varying substrate temperature, the RGO E/A is relatively higher at about 10° C. Thus, the effect of improving the selectivity due to the addition of water vapor ($H_2O$) to the etching gas is the best at about 10° C.

Figure 7:
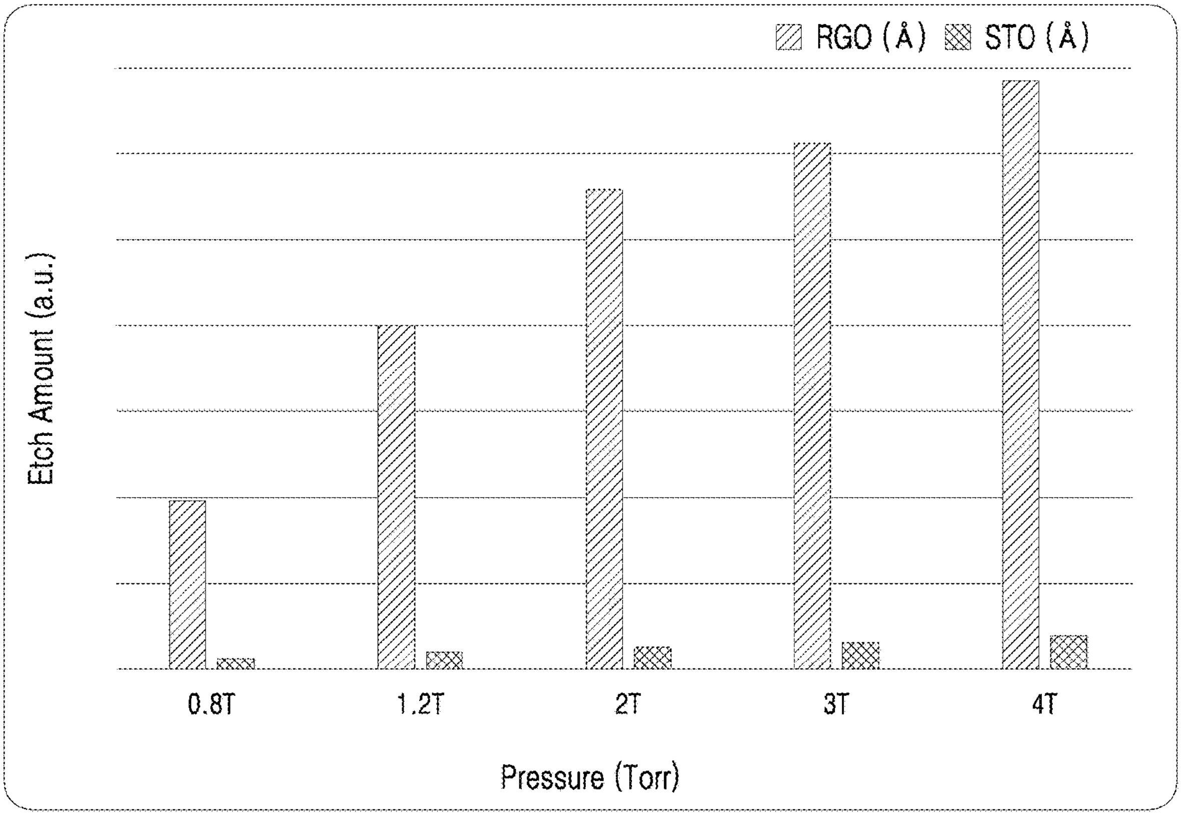
FIG. 7 shows a difference between etched amounts based on a process pressure of a re-growth silicon oxide (RGO) layer and a silicon oxide layer (STO) of the stack using HF and water vapor.
Figure 8:
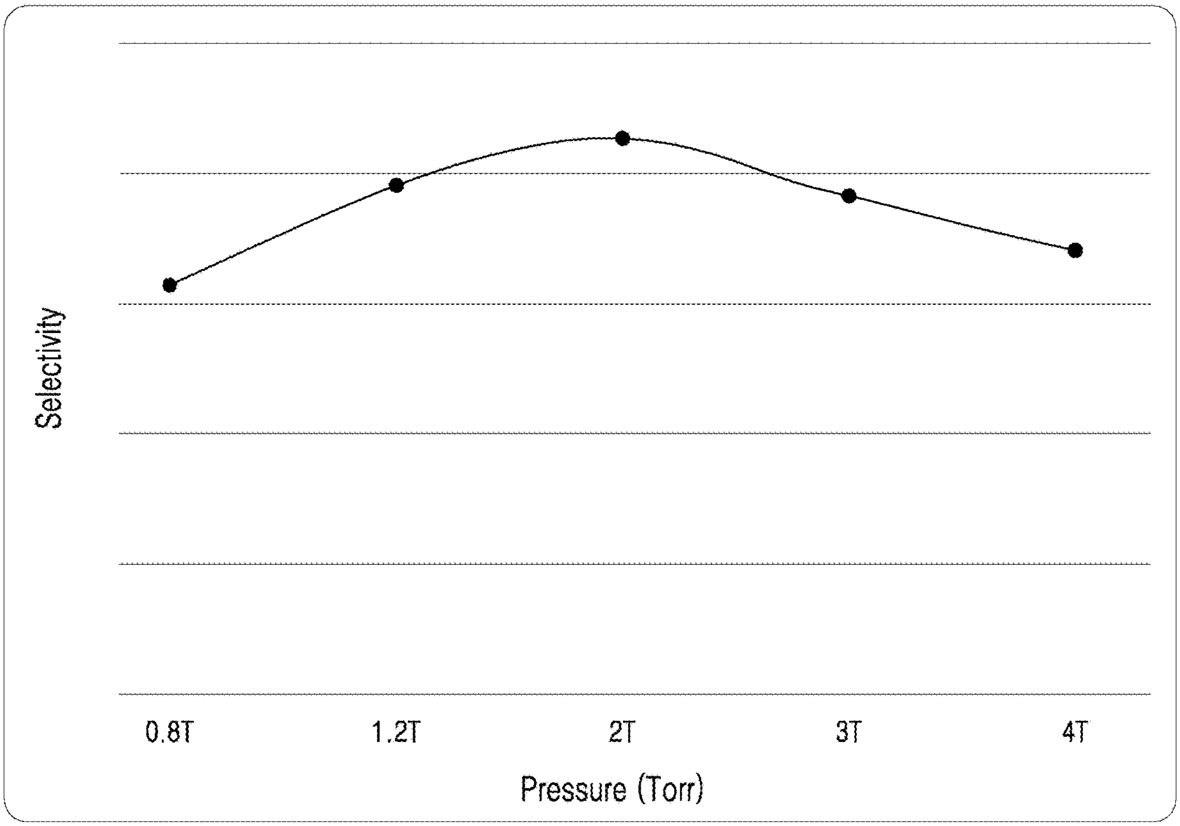
FIG. 8 shows a difference between etch selectivity based on a process pressure of a re-growth silicon oxide (RGO) layer and a silicon oxide layer (STO) of the stack using HF and water vapor.

FIG. 7 and Table 2 show a difference between etched amounts based on a process pressure of a re-growth silicon oxide (RGO) layer and a silicon oxide layer (STO) of the stack using HF and water vapor. FIG. 8 and Table 2 show a difference between etch selectivity based on a process pressure of a re-growth silicon oxide (RGO) layer and a silicon oxide layer (STO) of the stack using HF and water vapor. Referring to Table 2, the HF and water vapor flow rates used for etching are as follows.

HF: 100 sccm

Water vapor: 300 sccm

TABLE 2

| Temperature (° C.) | 10 | 10 | 10 | 10 | 10 |
|---|---|---|---|---|---|
| Pressure (Torr) | 0.8 | 1.2 | 2 | 3 | 4 |
| RGO (Å) | 3.125 | 6.412 | 8.945 | 9.774 | 10.962 |
| a.u | 0.390625 | 0.8015 | 1.118125 | 1.22175 | 1.37025 |
| STO (Å) | 0.198 | 0.327 | 0.419 | 0.513 | 0.641 |
| a.u | 0.02475 | 0.040875 | 0.052375 | 0.064125 | 0.080125 |
| Selectivity | 15.78283 | 19.60856 | 21.34845 | 19.05263 | 17.1014 |

Referring to Table 2, it may be identified that as the pressure increases, the etched amounts of RGO and STO simultaneously increase (a slight increase in the STO compared to RGO), and the selectivity is the best at about 2 Torr.

Figure 9:
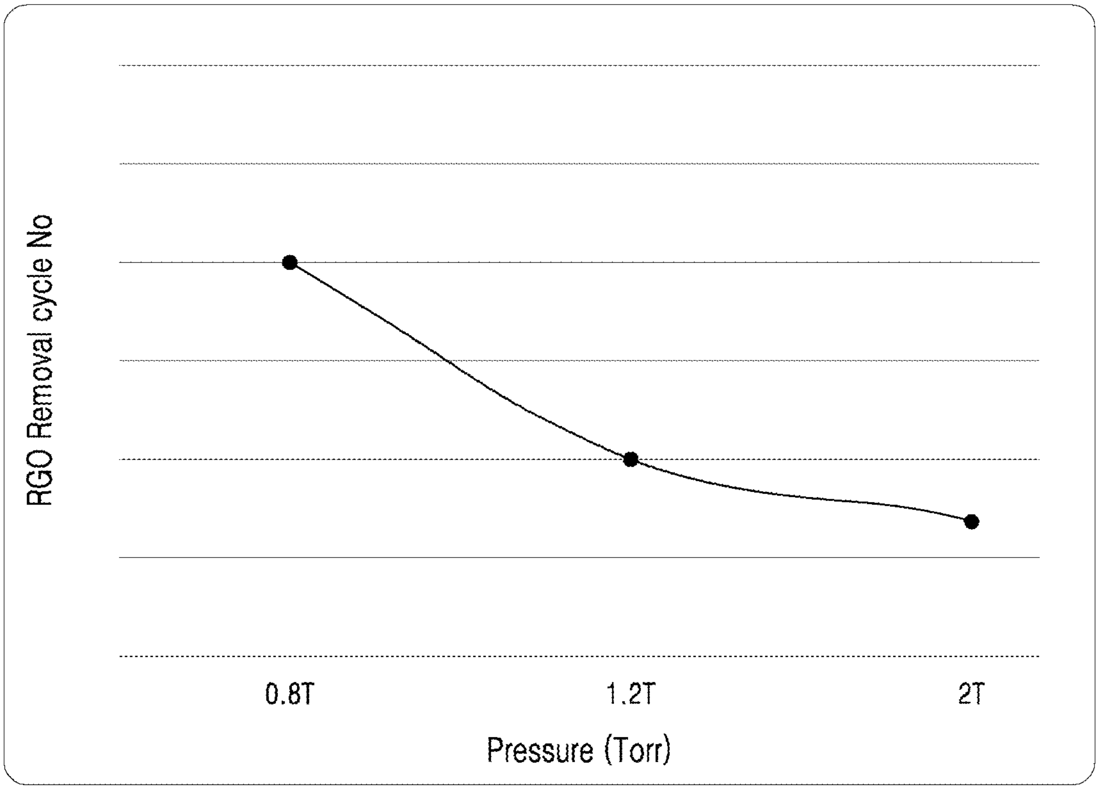
FIG. 9 shows the number of cycles required to remove the re-growth silicon oxide film based on the process pressure.
Figure 10:
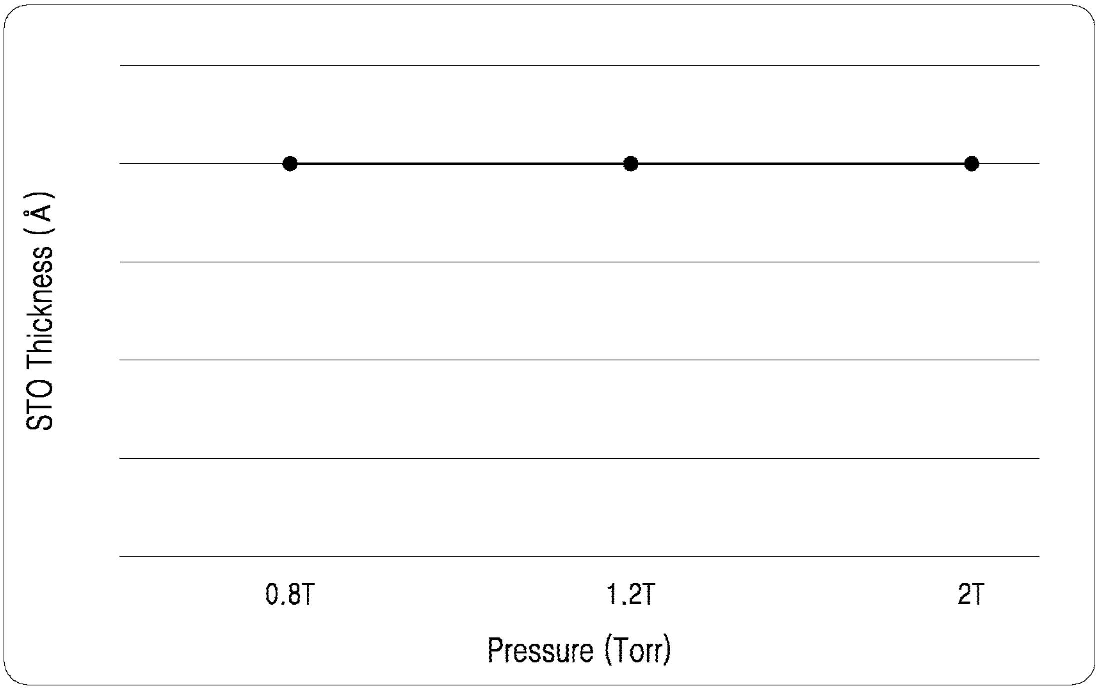
FIG. 10 shows the STO thickness required to remove the re-growth silicon oxide film based on the process pressure.

FIG. 9 and Table 3 show the number of cycles required to remove the re-growth silicon oxide film based on the process pressure. FIG. 10 and Table 3 show the STO thickness required to remove the re-growth silicon oxide film based on the process pressure. Referring to Table 3, the HF and water vapor flow rates used for etching are as follows.

HF: 84 sccm

Water vapor: 200 sccm

TABLE 3

| Temperature (° C.) | 10° C. | 10° C. | 10° C. |
|---|---|---|---|
| Pressure (Torr) | 0.8 T | 1.2 T | 2 T |
| RGO Removal cycle | 20 | 10 | 7 |
| STO Thickness | 200 | 200 | 200 |

Referring to Table 3, it may be identified that since the number of cycles related to the RGO removal cycle is the smallest under the condition of about 2 Torr, the regrowth silicon oxide removal rate is higher at the condition of about 2 Torr. Further, the STO thickness is substantially constant throughout the pressure range.

Figure 11:
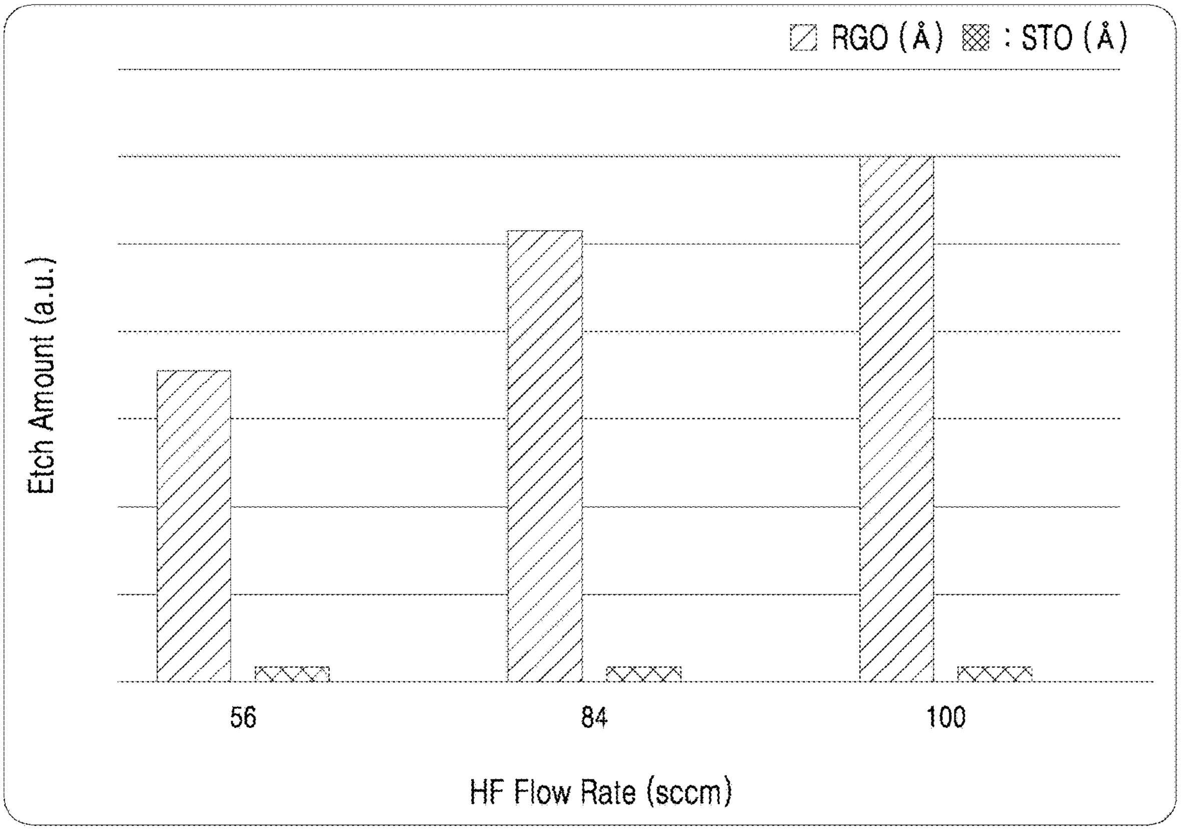
FIG. 11 shows a difference between etched amounts based on a HF flow rate of a re-growth silicon oxide (RGO) layer and a silicon oxide layer (STO) of the stack.
Figure 12:
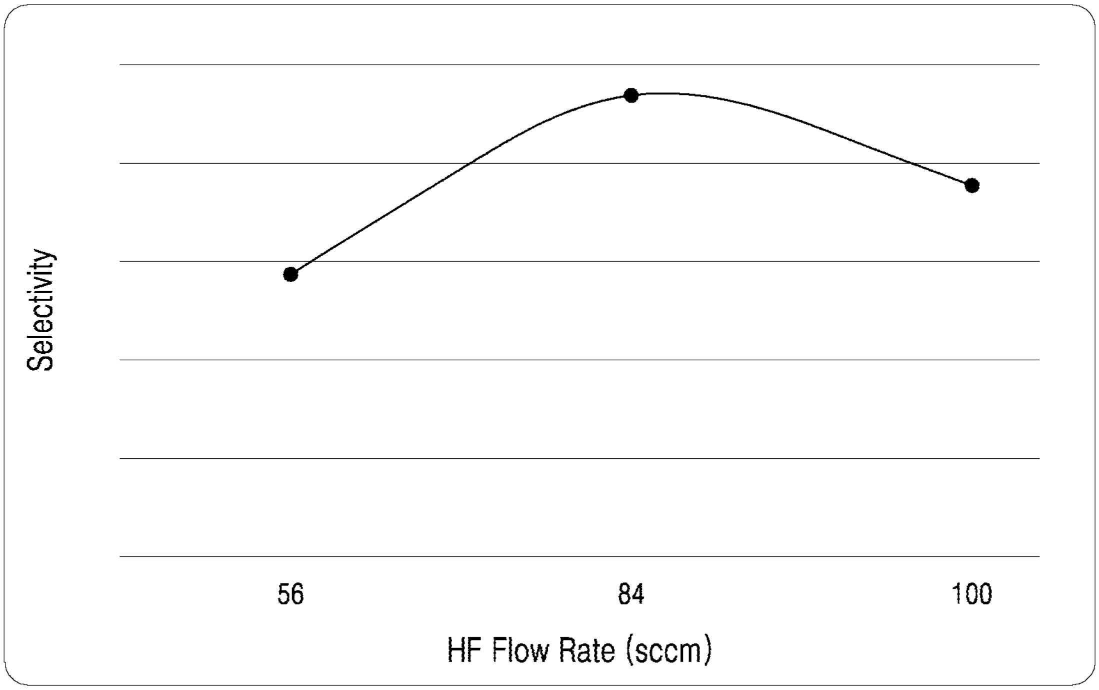
FIG. 12 shows a difference between etch selectivity based on a HF flow rate of a re-growth silicon oxide (RGO) layer and a silicon oxide layer (STO) of the stack.

FIG. 11 and Table 4 show a difference between etched amounts based on a HF flow rate of a re-growth silicon oxide (RGO) layer and a silicon oxide layer (STO) of the stack. FIG. 12 and Table 4 show a difference between etch selectivity based on a HF flow rate of a re-growth silicon oxide (RGO) layer and a silicon oxide layer (STO) of the stack. Referring to Table 4, the water vapor flow rate, the substrate temperature, and the process pressure used for etching are as follows.

Water vapor flow rate: 200 sccm

Substrate temperature: 10° C.

Process pressure: 2 Torr

TABLE 4

| HF flow rate (sccm) | 56 | 84 | 100 |
|---|---|---|---|
| RGO (Å) | 5.7 | 8.2 | 9.6 |
| a.u | 0.7125 | 1.025 | 1.2 |
| STO (Å) | 0.294 | 0.288 | 0.401 |
| a.u | 0.03675 | 0.036 | 0.050125 |
| Selectivity | 19.38776 | 28.47222 | 23.94015 |

Referring to Table 4, it may be identified that as the HF flow rate increases, the etched amounts of the RGO and STO simultaneously increase (a slight increase in STO compared to RGO), and the etch selectivity of the re-growth silicon oxide is the best under the 84 sccm condition of the HF flow rate.

Figure 13:
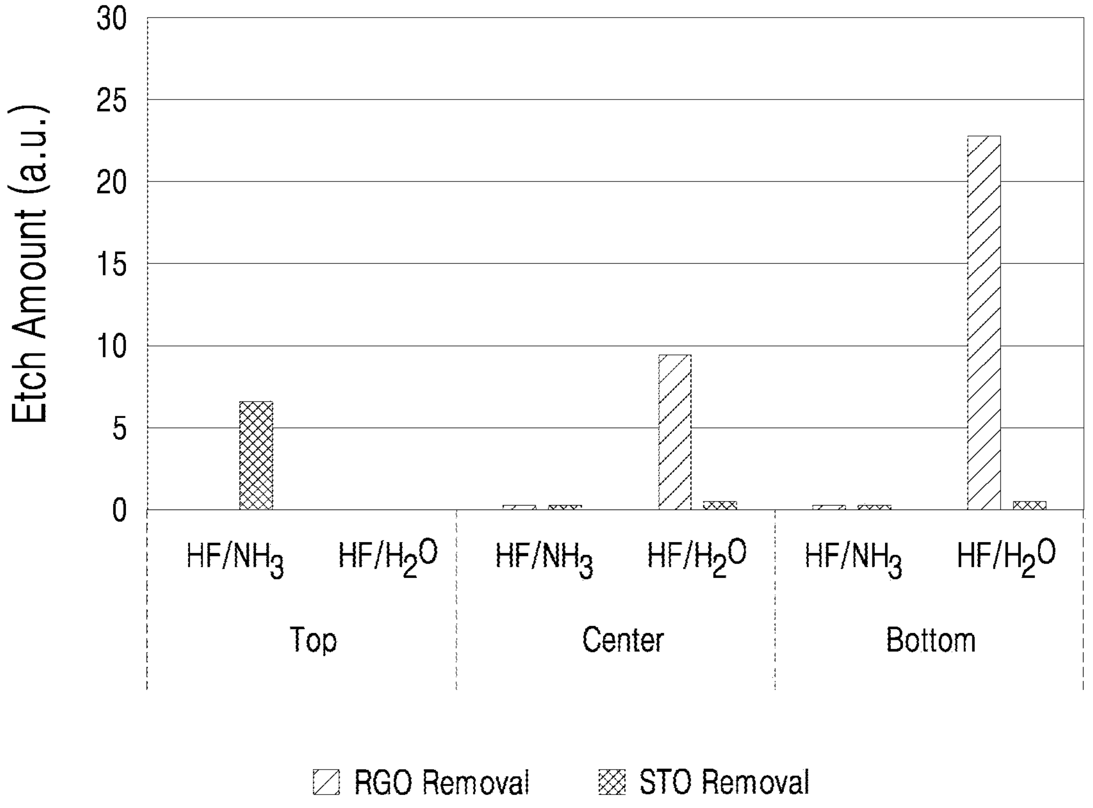
FIG. 13 shows the results of measuring the etched amount of each of the re-growth silicon oxide film and the silicon oxide layer constituting the ONO stack in each of a case when HF+$H_2O$ is used as the etching gas, and a case when HF+$NH_3$ is used as the etching gas.

FIG. 13 shows the results of measuring the etched amount of each of the re-growth silicon oxide film and the silicon oxide layer constituting the ONO stack in each of a case when $HF+H_2O$ is used as the etching gas, and a case when $HF+NH_3$ is used as the etching gas. That is, FIG. 13 shows the results of measuring the etched amount of each of the re-growth silicon oxide film and the silicon oxide layer constituting the ONO stack when the dry-etching process is performed under the same etching conditions, that is, the same flow rate, the same temperature, and the same pressure, except for the composition of the etching gas for removing the re-growth silicon oxide layer.

Referring to FIG. 13, referring to FIG. 13, it may be identified that when $HF+NH_3$ is used as an etching gas for removing the re-grown silicon oxide layer, the etched amount of the silicon oxide layer of the ONO stack at the upper portion of the ONO stack is higher. This may be due to the fact that damage to the silicon oxide layer of the upper portion of the ONO stack is severe due to adsorption of $NH_3$ to the silicon oxide layer of the upper portion of the ONO stack. Further, it may be identified that there is little effect of removing the re-growth silicon oxide film throughout the upper, middle, and lower portions of the ONO stack.

On the other hand, it may be identified that when $HF+H_2O$ is used as the etching gas for removing the re-growth silicon oxide film in accordance with an embodiment of the present disclosure, the etch selectivity of the re-growth silicon oxide film at the middle portion and the lower portion of the ONO stack is relatively higher, and particularly, the etch selectivity of the re-growth silicon oxide film at the lower portion of the ONO stack is very high.

Figure 14:
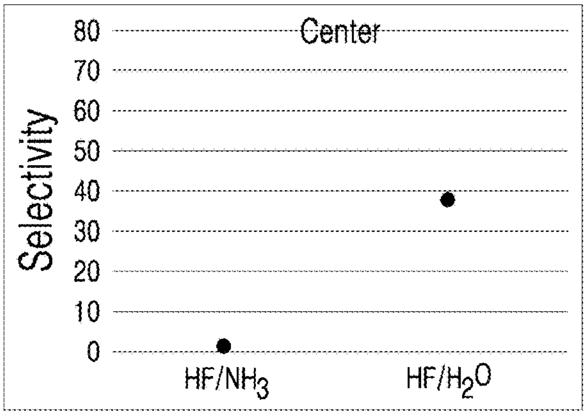
FIG. 14 shows an etch selectivity of a re-growth silicon oxide layer at a middle portion and a lower portion Bottom portion of a stack in each of a case when HF+$H_2O$ is used as the etching gas, and a case when HF+$NH_3$ is used as the etching gas.
Figure 14:
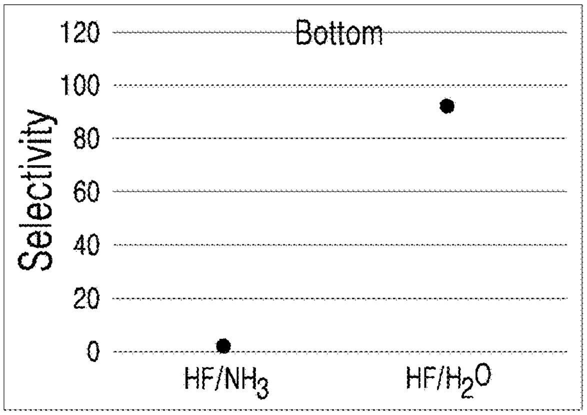

FIG. 14 shows an etch selectivity of a re-growth silicon oxide layer at a middle portion and a lower portion Bottom portion of a stack in each of a case when $HF+H_2O$ is used as the etching gas, and a case when $HF+NH_3$ is used as the etching gas. That is, FIG. 14 shows an etch selectivity of a re-growth silicon oxide layer at a middle portion and a lower portion Bottom portion of a stack when the dry-etching process is performed under the same etching conditions, that is, the same flow rate, the same temperature, and the same pressure, except for the composition of the etching gas for removing the re-growth silicon oxide layer.

Referring to FIG. 14, it may be identified that when $HF+NH_3$ is used as an etching gas for removing the re-growth silicon oxide film, an etch selectivity of the re-growth silicon oxide film at the middle portion and the lower portion of the ONO stack is very low. However, it may be identified that when $HF+H_2O$ is used as an etching gas for removing the re-growth silicon oxide layer according to an embodiment of the present disclosure, the etch selectivity of the re-growth silicon oxide layer at the middle portion and the lower portion of the ONO stack is relatively higher, and particularly, the etch selectivity of the re-growth silicon oxide layer at the lower portion of the ONO stack is very high. In addition, it may be identified that damage to the silicon oxide layer constituting the ONO stack has hardly occurred, unlike the case where $HF+NH_3$ is used.

As described above, the substrate processing method of the present disclosure can effectively remove the re-growth silicon oxide generated during wet-etching of the silicon nitride layer, using the dry-etching using HF+ water vapor at low temperature, and can increase the etch selectivity of the re-growth silicon oxide compared to the etch selectivity of the oxide formed via the deposition or the like through the control of the type and the flow rate of the etching gas, the substrate temperature, and the process pressure.

Although the present disclosure has been described with reference to the accompanying drawings, the present disclosure is not limited by the embodiments disclosed herein and the drawings, and it is obvious that various modifications may be made by those skilled in the art within the scope of the technical idea of the present disclosure. In addition, although the effects based on the configuration of the present disclosure are not explicitly described and illustrated in the description of the embodiment of the present disclosure above, it is obvious that predictable effects from the configuration should also be recognized.

The invention claimed is:

1. A method for processing a substrate so as to selectively etch a re-growth silicon oxide formed on a surface of a silicon oxide layer and having a density lower than a density of the silicon oxide layer, the method comprising:

(a) placing a substrate including the re-growth silicon oxide into a reaction chamber; and (b) supplying an etching gas into the reaction chamber to dry-etch the re-growth silicon oxide formed on the surface of the silicon oxide layer, wherein the dry-etching is performed using HF and $H_2O$ as an etching gas at about −10° C. to 10° C., at a process pressure of about 1.2 to 3.0 Torr, and at a HF flow rate of about 70 to 100 sccm.

2. The method for processing the substrate of claim 1, wherein the (b) is performed at a $H_2O$ flow rate of about 50 to 300 sccm.

3. The method for processing the substrate of claim 1, wherein the method further comprises, after the dry-etching, raising a temperature of the substrate to remove a reaction by-product.

4. The method for processing the substrate of claim 3, wherein the dry-etching, the substrate temperature raising, and purging constitute a unit cycle, wherein the method further comprises performing a plurality of unit cycles.

5. A method for processing a substrate, the method comprising:

(a) wet-etching a silicon nitride layer on a substrate having a stack formed thereon, using a phosphoric acid-based etchant, wherein the stack has a structure in which silicon oxide layers and silicon nitride layers are stacked on top of each other, wherein a re-growth silicon oxide is formed on a surface of the silicon oxide layer in the wet-etching; and (b) dry-etching the re-growth silicon oxide formed on the surface of the silicon oxide layer using an etching gas, wherein the (b) is performed using HF and $H_2O$ as the etching gas at about −10° C. to 10° C., at a process pressure of about 1.2 to 3.0 Torr, and at a HF flow rate of about 70 to 100 sccm.

6. The method for processing the substrate of claim 5, wherein the (b) is performed at a $H_2O$ flow rate of about 50 to 300 sccm.

7. The method for processing the substrate of claim 5, wherein the method further comprises, after the dry-etching, raising a temperature of the substrate to remove a reaction by-product.

8. The method for processing the substrate of claim 7, wherein the dry-etching, the substrate temperature raising, and purging constitute a unit cycle, wherein the method further comprises performing a plurality of unit cycles.

* * * * *